(12) United States Patent
Jung et al.

(10) Patent No.: US 10,335,981 B2
(45) Date of Patent: Jul. 2, 2019

(54) DISPLAY APPARATUS AND METHOD OF MANUFACTURING THE SAME

(71) Applicant: Samsung Display Co., LTD., Yongin, Gyeonggi-Do (KR)

(72) Inventors: Kyu-Ho Jung, Osan-si (KR); Young-In Lim, Cheonan-si (KR); Jun-Ho Kwack, Geumsan-gun (KR); Sang-Hee Choi, Daegu (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1261 days.

(21) Appl. No.: 14/332,688

(22) Filed: Jul. 16, 2014

(65) Prior Publication Data
US 2015/0030799 A1    Jan. 29, 2015

(30) Foreign Application Priority Data

Jul. 24, 2013  (KR) .................. 10-2013-0087143

(51) Int. Cl.
| | |
|---|---|
| *B29C 35/08* | (2006.01) |
| *B29C 35/02* | (2006.01) |
| *H01L 51/00* | (2006.01) |
| *H01L 51/52* | (2006.01) |
| *B29L 9/00* | (2006.01) |
| *B29L 31/34* | (2006.01) |

(52) U.S. Cl.
CPC ...... *B29C 35/0805* (2013.01); *B29C 35/0266* (2013.01); *H01L 51/0024* (2013.01);
(Continued)

(58) Field of Classification Search
CPC .............. H01L 51/524; H01L 51/5246; B32B 2037/243; B32B 2457/20; B32B 37/24;
(Continued)

(56) References Cited

U.S. PATENT DOCUMENTS

| | | | | |
|---|---|---|---|---|
| 5,596,024 A | * | 1/1997 | Horie ...................... | C09K 3/10 522/103 |
| 2005/0151894 A1 | * | 7/2005 | Katsuda ............ | G02F 1/133308 349/58 |

(Continued)

FOREIGN PATENT DOCUMENTS

| | | |
|---|---|---|
| KR | 1020100008475 A | 1/2010 |
| KR | 1020100044228 A | 4/2010 |

(Continued)

OTHER PUBLICATIONS

WO-2014073348-A1—translation and Bib data; May 2014; Itoh, Kohji.*

(Continued)

*Primary Examiner* — Humera N Sheikh
*Assistant Examiner* — Elizabeth D Ivey
(74) *Attorney, Agent, or Firm* — Cantor Colburn LLP

(57) ABSTRACT

A display apparatus includes a first substrate including a display region and a peripheral region, where the peripheral region surrounds the display region, a second substrate disposed opposite to the first substrate, a resin layer disposed between the first substrate and the second substrate, where the resin layer covers a surface of the second substrate, a first member disposed at a bottom surface of the second substrate corresponding to the peripheral region of the first substrate, where the first member covers a portion of the resin layer, and a second member which surrounds the first substrate, the second substrate, the first member and the resin layer, where the second member is disposed at opposing side portions of the second substrate, the second member is spaced apart from the first substrate, and the second member surrounds opposing side portions of the resin layer.

14 Claims, 14 Drawing Sheets

(52) U.S. Cl.
CPC .. *H01L 51/5246* (2013.01); *B29C 2035/0827* (2013.01); *B29C 2035/0838* (2013.01); *B29L 2009/00* (2013.01); *B29L 2031/3475* (2013.01); *Y10T 428/23* (2015.01)

(58) Field of Classification Search
CPC .... B32B 2037/1253; B32B 2310/0831; B32B 37/10; B32B 37/1284; H05K 13/0469; H05K 7/02
See application file for complete search history.

(56) References Cited

U.S. PATENT DOCUMENTS

| | | | | |
|---|---|---|---|---|
| 2005/0255618 | A1* | 11/2005 | Kiyomiya | G02F 1/1339 438/26 |
| 2008/0101001 | A1* | 5/2008 | Shin | G02B 6/0088 361/679.01 |
| 2009/0011197 | A1* | 1/2009 | Matsuhira | G02F 1/133308 428/192 |
| 2015/0008014 | A1* | 1/2015 | Zhou | G06F 3/044 174/251 |
| 2015/0296634 | A1* | 10/2015 | Itoh | G02F 1/133308 361/679.01 |

FOREIGN PATENT DOCUMENTS

| | | | | |
|---|---|---|---|---|
| KR | 1020120129748 A | | 11/2012 | |
| WO | WO-2014073348 A1 | * | 5/2014 | ....... G02F 1/133308 |
| WO | WO-2014121582 A1 | * | 8/2014 | ............ G06F 3/044 |

OTHER PUBLICATIONS

WO-2014121582-A1; translation and Bib data; Aug. 2014; Gao, Yulong.*

* cited by examiner

DISPLAY APPARATUS AND METHOD OF MANUFACTURING THE SAME

This application claims priority to Korean Patent Application No. 10-2013-0087143, filed on Jul. 24, 2013, and all the benefits accruing therefrom under 35 U.S.C. § 119, the content of which in its entirety is herein incorporated by reference.

BACKGROUND

1. Field

Exemplary embodiments of the invention relate to a display apparatus. More particularly, exemplary embodiments of the invention relate to a display apparatus and a method of manufacturing the display apparatus.

2. Description of the Related Art

In a manufacturing process of the display apparatus, a tempered glass may be provided on a display panel to protect the display panel. In such a process, an edge member of the display apparatus may be provided at opposing side portions of the tempered glass and the display panel.

When the tempered glass is disposed on the display panel, a resin may be spread between the tempered glass and the display panel, and the tempered glass and the display panel is bonded by the resin. The edge member may block the resin from flowing out of an edge of the display panel.

However, when the resin is spread after the edge member is formed, a bubble may be generated between the tempered glass and the display panel, and such a bubble may reduce a brightness of the display panel.

SUMMARY

Exemplary embodiments provide a display apparatus that improves an efficiency of spreading a resin.

Exemplary embodiments provide a method of manufacturing the display apparatus.

According to an exemplary embodiment of the invention, a display apparatus includes: a first substrate including a display region and a peripheral region, where the peripheral region surrounds the display region; a second substrate disposed opposite to the first substrate, a resin layer disposed between the first substrate and the second substrate, where the resin layer covers a surface of the second substrate; a first member disposed at a bottom surface of the second substrate corresponding to the peripheral region of the first substrate, where the first member covers a portion of the resin layer; and a second member which surrounds the first substrate, the second substrate, the first member and the resin layer, where the second member is disposed at opposing side portions of the second substrate, the second member is spaced apart from the first substrate, and the second member surrounds opposing side portions of the resin layer.

In exemplary embodiments, the resin layer disposed on the second substrate may be pressurized by a top surface of the first substrate, and the resin layer may have a thin film structure disposed between the first substrate and the second substrate.

In exemplary embodiment, the resin layer may be disposed in a space between the first substrate and the second substrate and between opposing side portions of the first substrate and the second member.

In exemplary embodiment, a distal end of the resin layer may include a photo-cured resin.

In exemplary embodiment, a size of the second substrate may be larger than a size of the first substrate.

According to another exemplary embodiment of the invention, a method of manufacturing a display apparatus includes: providing a first member of the display apparatus at a bottom surface of a second substrate of the display apparatus in a peripheral region of the second substrate, where the peripheral region surrounds a display region of the display apparatus; providing a second member in the peripheral region of the second substrate, in which the first member is provided, to surround the second substrate; disposing a resin at a bottom surface of the second substrate; pressurizing the resin on the bottom surface of the second substrate by disposing a top surface of a first substrate on the resin to form a resin layer disposed in a space between the first substrate and the second substrate and a space between opposing side portions of the first substrate and the second member; and curing a distal end of the resin layer by irradiating an ultra violet ray of a laser irradiation device.

In exemplary embodiments, a size of the second substrate may be larger than a size of the first substrate.

According to another exemplary embodiment of the invention, a display apparatus includes: a first substrate including a display region and a peripheral region, where the peripheral region surrounds the display region; a second substrate disposed opposite to the first substrate; a resin layer disposed between the first substrate and the second substrate, where the resin layer covers the second substrate; a first member disposed at a bottom surface of the second substrate corresponding to the peripheral region of the first substrate, where the first member covers a portion of the resin layer; and a complex member which surrounds the first substrate, the second substrate, the first member and the resin layer, where the complex member is disposed at opposing side portions of the second substrate, and the complex member is spaced apart from the first substrate.

In exemplary embodiments, the complex member may include a first part which covers a portion of a top surface of the second substrate corresponding to the peripheral region; and a second part which covers a portion of a bottom surface of the second substrate corresponding to the peripheral region.

In exemplary embodiments, the first part and the second part may be separable from each other.

In exemplary embodiments, the resin layer disposed on the second substrate may be pressurized by a top surface of the first substrate, and the resin layer may have a thin film structure disposed between the first substrate and the second substrate.

In exemplary embodiments, the resin layer may be disposed in a space between the first substrate and the second substrate and between opposing side portions of the first substrate and the complex member.

In exemplary embodiments, a distal end of the resin layer may include a photo-cured resin.

In exemplary embodiments, a size of the second substrate may be larger than a size of the first substrate.

In exemplary embodiments, the complex member may be separable from the second substrate and the resin layer.

According to another exemplary embodiment of the invention, a manufacturing device of a display apparatus includes: a first substrate includes a display region and a peripheral region, where the peripheral region surrounds the display region; a second substrate disposed opposite to the first substrate; a resin layer disposed between the first substrate and the second substrate, where the resin layer covers the second substrate; a first member disposed at a bottom surface of the second substrate corresponding to the peripheral region of the first substrate, where the first member covers a portion of the resin layer; at least four second members which surround the first substrate and the resin layer, where each of the at least four second members is disposed at the bottom surface of the second substrate in the peripheral region and spaced apart from the first substrate; and a joint member configured to move forward to and backward from the first substrate, the joint member is coupled to each of the at least four second members.

In exemplary embodiment, the resin layer disposed on the second substrate may be pressurized by a top surface of the first substrate, and the resin layer may have a thin film structure disposed between the first substrate and the second substrate.

In exemplary embodiments, the resin layer may be disposed in a space between the first substrate and the second substrate and a space between the opposing side portions of the first substrate and the second member.

In exemplary embodiments, may further include a laser irradiation device which irradiates an ultra violet ray to a distal end of the resin.

In exemplary embodiments, a size of the second substrate may be larger than a size of the first substrate.

In exemplary embodiments, the second member may not be adhered to the resin layer.

According to exemplary embodiments of the display apparatus of the invention, an efficiency of spreading a resin is improved, and a generation of a bubble in a resin layer may be effectively prevented.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
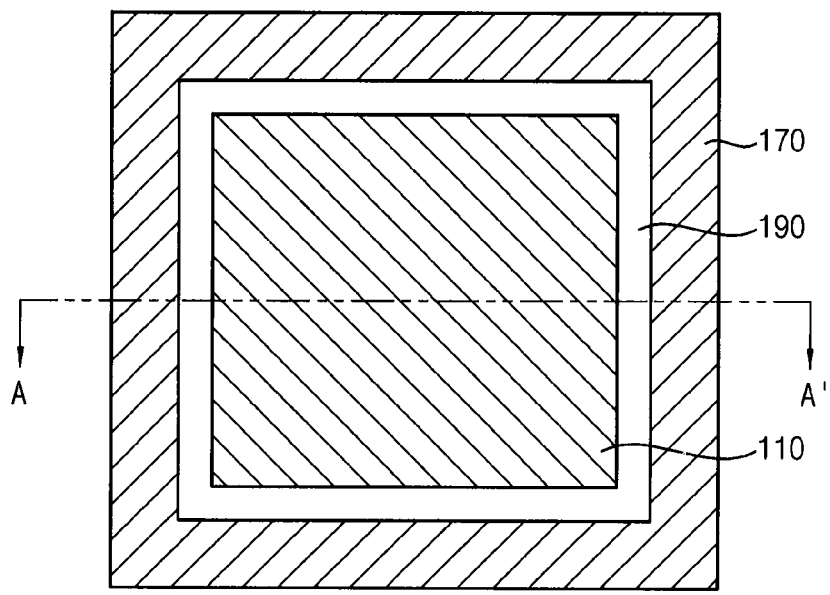
FIG. 1 is a plane view illustrating an exemplary embodiment of a display apparatus in accordance with the invention.

The invention will be described more fully hereinafter with reference to the accompanying drawings, in which exemplary embodiments are shown. The invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals generally refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For exemplary, if the apparatus in the figures is turned over, elements described as "below" or "beneath" other elements or features would then be oriented "above" the other elements or features. Thus, the example term "below" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross sectional illustrations that are schematic illustrations of illustratively idealized exemplary embodiments (and intermediate structures) of the invention. As such, variations from the shapes of the illustrations as a result, for exemplary, of manufacturing techniques and/or tolerances, are to be expected. Thus, exemplary embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein Hereinafter, exemplary embodiments of the invention will be described in further detail with reference to accompanying drawings.

Figure 2:
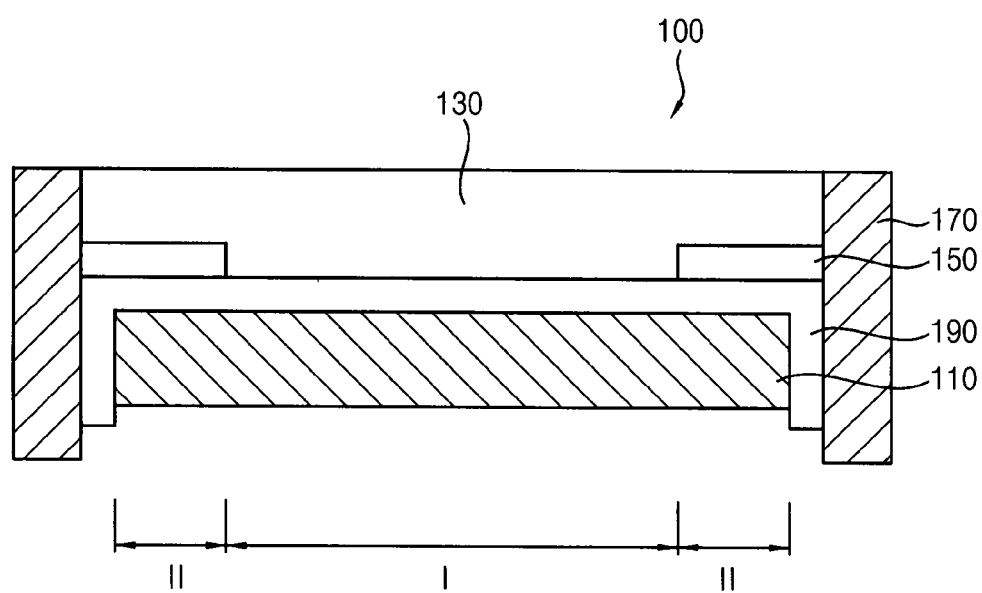
FIG. 2 is a cross-sectional view taken along line A-A' in FIG. 1.

FIG. 1 is a plane view illustrating an exemplary embodiment of a display apparatus in accordance with the invention, and FIG. 2 is a cross-sectional view taken along line A-A' in FIG. 1.

Referring to FIG. 1 and FIG. 2, a display apparatus 100 may include a first substrate 110, a second substrate 130, a first member 150, a second member 170 and a resin layer 190.

The first substrate 110 may include a display panel. In one exemplary embodiment, for example, the first substrate 110 may include an organic light emitting diode ("OLED") panel including an OLED and a thin film transistor ("TFT"). The first substrate 110 may include a display region I and a peripheral region II. The display region I may be disposed in a middle portion of the first substrate 110, the peripheral region II may be disposed on opposing side portions of the first substrate 110, and the peripheral region II may surround at least a portion of the display region I. The first substrate 110 may include glass-based materials, flexible plastic-based materials, or the like, for example. In one exemplary embodiment, for example, the first substrate 110 may include a glass substrate, a quartz substrate, a polymer resin substrate, or the like.

The second substrate 130 may be disposed opposite to the first substrate 110. The second substrate 130 may include transparent glass materials. In one exemplary embodiment, for example, the second substrate 130 may include a tempered glass. In an exemplary embodiment, a size of the second substrate 130 may be larger than a size of the first substrate 110. The resin layer 190 may be disposed between the first substrate 110 and the second substrate 130. In such an embodiment, the size of the second substrate 130 and the first substrate 110 may be an area when viewed from a top view. In an exemplary embodiment, the resin layer 190 may be substantially thin, such that a distance between the first substrate 110 and the second substrate 130 may be substantially short, and a difference of the size of the first substrate 110 and the size of the second substrate 130 may be substantially small.

In an exemplary embodiment, as illustrated in FIG. 1, the second member 170 may surround at least a portion of the resin layer 190 and the first substrate 110. The second substrate 130 which has substantially the same size as the resin layer 190 may be disposed on a surface (e.g., a top surface) of the resin layer 190.

The first member 150 may be disposed on a surface (e.g., a bottom surface) of the second substrate 130 in the peripheral region II. The first member 150 may include light shielding materials. The first member 150 may have a black color. In one exemplary embodiment, for example, the first member 150 may include a black matrix.

The second member 170 may surround at least a portion (e.g., side portions) of the first substrate 110, the second substrate 130, the first member 150 and the resin layer 190, and may be disposed at opposing side portions of the second substrate 130 and spaced apart from the first substrate 110.

In a lamination process of an exemplary embodiment of a method of manufacturing the display apparatus 100, a resin deposed on the second substrate 130 may be pressurized by the first substrate 110. The pressurized resin provided between the first substrate 110 and the second substrate 130 may have a shape of a thin layer. In such a lamination process, a block member that blocks a resin flowing into an outside may be provided at the opposing side portions of the first substrate 110 and the second substrate 130. In an exemplary embodiment, the second member 170 may function substantially as the block member. In such an embodiment, the second member 170 may not completely block the resin, and the second member 170 may guide the resin to fill in a space between the first substrate 110 and the second member 170 spaced apart from the first substrate 110.

The resin layer 190 may be disposed between the first substrate 110 and the second substrate 130 and between the first substrate 110 and the second member 170, and the resin layer 190 may cover a top surface of the first substrate 110. The resin layer 190 may include a photopolymer resin. The photopolymer resin may have a high transmittance and high adhesion to a predetermined material. The resin layer 190 may have high adhesion to the first substrate 110, the second substrate 130 and the second member 170. In the lamination process of an exemplary embodiment of a method of manufacturing the display apparatus 100, a distal end of the resin, which is in a space between the first substrate 110 and the second member 170, is cured by an ultra violet ("UV") ray of a laser irradiation device such that the distal end of resin layer 190 includes a photo-cured resin. In such an embodiment, the laser irradiation device may irradiate the UV ray along with the bottom surface of the resin layer 190 between the first substrate 110 and the second member 170, and a bottom of the resin layer 190 may be cured.

FIGS. 3A to 3E are cross-sectional views showing an exemplary embodiment of a method of manufacturing the display apparatus of FIG. 2.

Figure 3A:
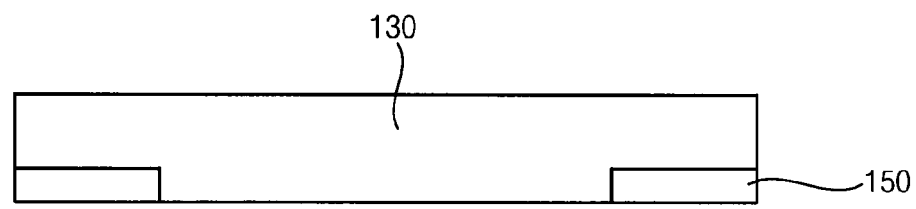
FIGS. 3A to 3E are cross-sectional views showing an exemplary embodiment of a method of manufacturing the display apparatus of FIG. 2.

Referring to FIG. 3A, a first member 150 may be provided, e.g., formed, at a bottom surface on a peripheral region II of the second substrate 130. In an exemplary embodiment, a polarizer ("POL") (not shown) may be further provided on the bottom surface of the second substrate 130 and on the first member 150. The POL may block light entered from an outside, and light emitted from a light emitting device of the display apparatus, e.g., an OLED, may pass through the POL toward the outside.

Figure 3B:
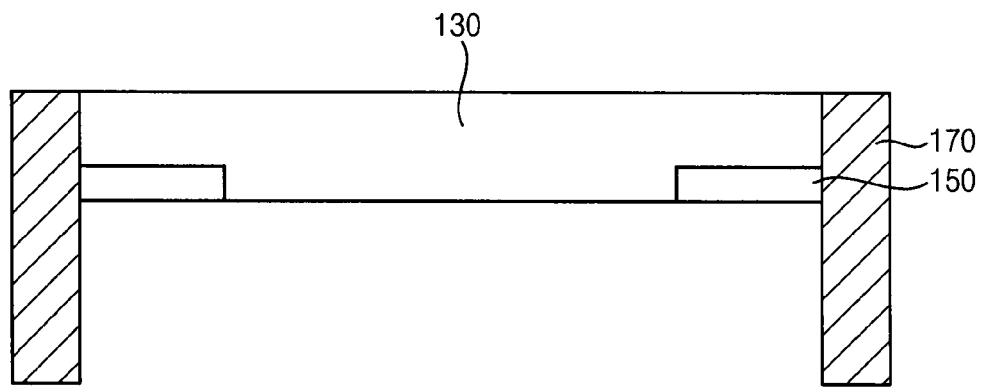

Referring to FIG. 3B, a second member 170 may be provided at opposing side portions of the second substrate 130.

Figure 3C:
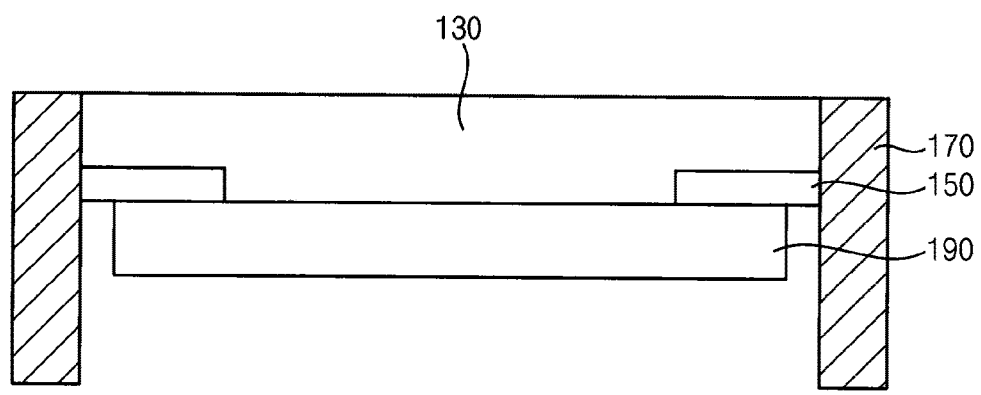

Referring to FIG. 3C, a resin may be provided, e.g., disposed, at a bottom of the second substrate 130. The resin may be a photopolymer resin, and may be in a liquid state.

Figure 3D:
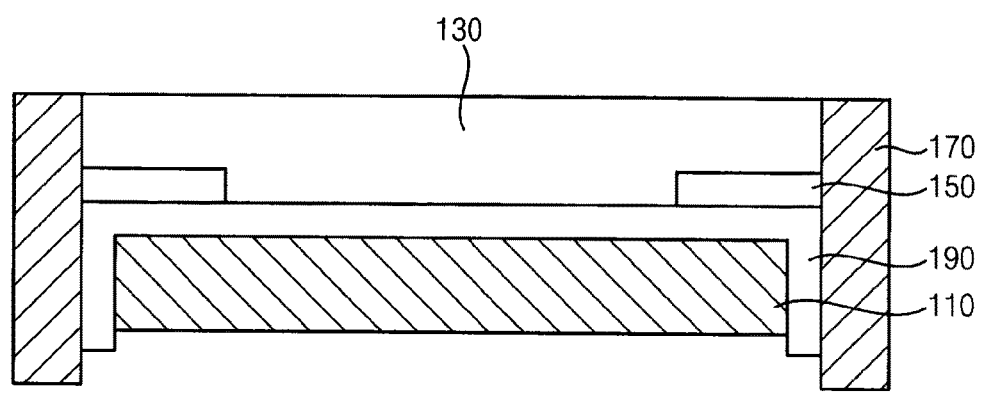

Referring to FIG. 3D, a first substrate 110 is provided to press the resin on the bottom surface of the second substrate 130. In such an embodiment, when the resin is pressurized by a top surface of the first substrate 110, the resin may fill a space between the first substrate 110 and second substrate 130, such that the resin may have a thin film structure disposed between the first substrate 110 and second substrate 130. In such an embodiment, the resin layer 190 may adhere to the first member 150, the second substrate 130 and the second member 170.

Figure 3E:
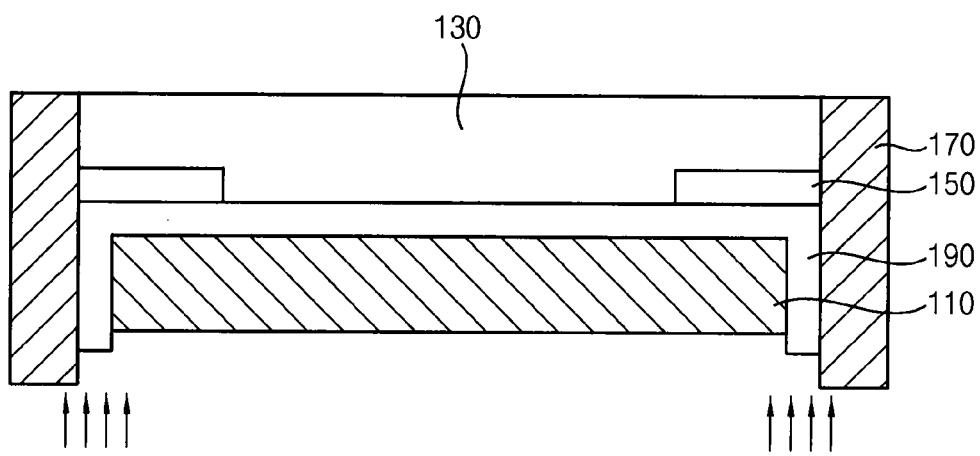

Referring to FIG. 3E, a distal end of the resin layer 190, which is in a liquid state, is cured by an UV ray of a laser irradiation device.

Accordingly, in such an embodiment of a manufacturing process of the display apparatus 100, the second member 170 is provided to the display apparatus 100, when the resin is formed between the first substrate 110 and the second substrate 130, a bubble is not generated in the resin layer 190, such that a defect in the display apparatus 100 may be substantially decreased.

Figure 4:
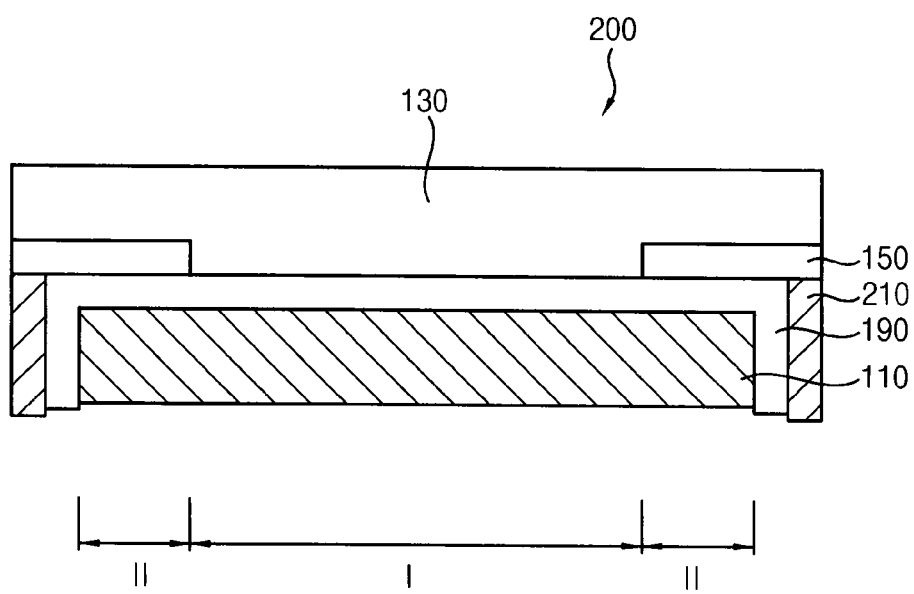
FIG. 4 is a cross-sectional view illustrating an alternative exemplary embodiment of a display apparatus in accordance with the invention.

FIG. 4 is a cross-sectional view illustrating an alternative exemplary embodiment of a display apparatus in accordance with the invention.

Referring to FIG. 4, a display apparatus 200 may include a first substrate 110, a second substrate 130, a third member 210 and a resin layer 190.

The first substrate 110 may include a display panel. In one exemplary embodiment, for example, the first substrate 110 may include an OLED panel including the OLED and a TFT. The first substrate 110 may include a display region I and a peripheral region II. The display region I may be disposed in a middle portion of the first substrate 110, the peripheral region II may be disposed on opposing side portions of the first substrate 110, and the peripheral region II may surround at least a portion of the display region I. The first substrate 110 may include glass-based materials, flexible plastic-based materials, or the like. In one exemplary embodiment, for example, the first substrate 110 may include a glass substrate, a quartz substrate, a polymer resin substrate, or the like.

The second substrate 130 may be disposed opposite to the first substrate 110. The second substrate 130 may include transparent glass materials. In one exemplary embodiment, for example, the second substrate 130 may include a tempered glass. A size of the second substrate 130 may be larger than a size of the first substrate 110. The resin layer 190 may be disposed between the first substrate 110 and the second substrate 130. In an exemplary embodiment, a thickness of the resin layer 190 may be substantially thin. Thus, a distance between the first substrate 110 and the second substrate 130 may be substantially short, and a difference of a size of the first substrate 110 and the second substrate 130 may be substantially small.

The first member 150 may be disposed at a surface (e.g., a top surface) of the second substrate 130 on the peripheral region II. The first member 150 may include light shielding materials. The first member 150 may have a black color. In one exemplary embodiment, for example, the first member 150 may include a black matrix.

The third member 210 may surround at least a portion (e.g., side portions) of the first substrate 110 and the resin layer 190, and may be disposed at a bottom surface on the peripheral region II of the second substrate 130 and spaced apart from the first substrate 110. In an exemplary embodiment, the third member 210 may adhere to the second substrate 130 by an adhesive member (not shown), and the third member 210 may be separate from the second substrate 130 after manufacturing process of the display apparatus 200. In such an embodiment, where the third member 210 separates from the second substrate 130, the third member 210 has substantially low adhesion to the resin layer 190. In such an embodiment, the third member 210 may include a material which has substantially low adhesion to a photopolymer resin. In one exemplary embodiment, for example, the third member 210 may include fluorine (F) or the like.

In a lamination process of an exemplary embodiment of a method of manufacturing the display apparatus 200, a resin deposed on the second substrate 130 may be pressurized by the first substrate 110. The pressurized resin between the first substrate 110 and the second substrate 130 may have a shape of a thin layer. In such a lamination process, a block member that blocks a resin flowing into an outside may be provided at opposing side portions of the first substrate 110 and the second substrate 130. The third member 210 may function substantially as the block member. In such an embodiment, the third member 210 may not substantially completely block the resin, and the third member 210 may guide the resin to fill in a space between the first substrate 110 and the third member 210 spaced apart from the first substrate 110.

The resin layer 190 may be disposed between the first substrate 110 and the second substrate 130 and between the first substrate 110 and the third member 210, and the resin layer 190 may cover a top surface of the first substrate 110. The resin layer 190 may include a photopolymer resin. The photopolymer resin may have a high transmittance a high adhesion to a predetermined material. The resin layer 190 may high adhesion to the first substrate 110 and the second substrate 130. In the lamination process of an exemplary embodiment of a method of manufacturing the display apparatus 200, a distal end of the resin, which is ejected from a space between the first substrate 110 and the third member 210 spaced apart from the first substrate 110, is cured by an UV ray of a laser irradiation device such that the distal end of resin layer 190 includes a photo-cured resin.

FIGS. 5A to 5F are cross-sectional views showing an exemplary embodiment of a method of manufacturing the display apparatus of FIG. 4.

Figure 5A:
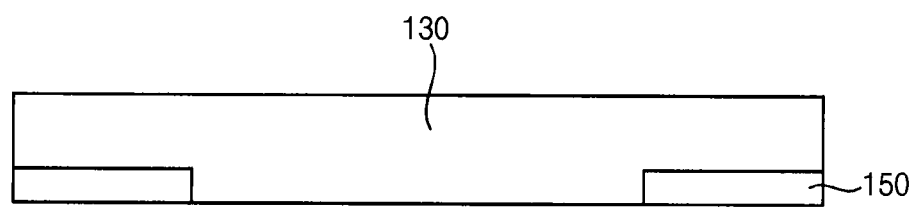
FIGS. 5A to 5F are cross-sectional views showing an exemplary embodiment of a method of manufacturing the display apparatus of FIG. 4.

Referring to FIG. 5A, a first member 150 may be provided, e.g., formed, at a bottom surface on a peripheral region II of the second substrate 130. In an exemplary embodiment, a POL (not shown) may be disposed at a bottom surface of the second substrate 130 and on the first member 150. The POL may block light entered from an outside, and light emitted from a light emitting device of the display apparatus, e.g., an OLED, may pass through the POL toward the outside.

Figure 5B:
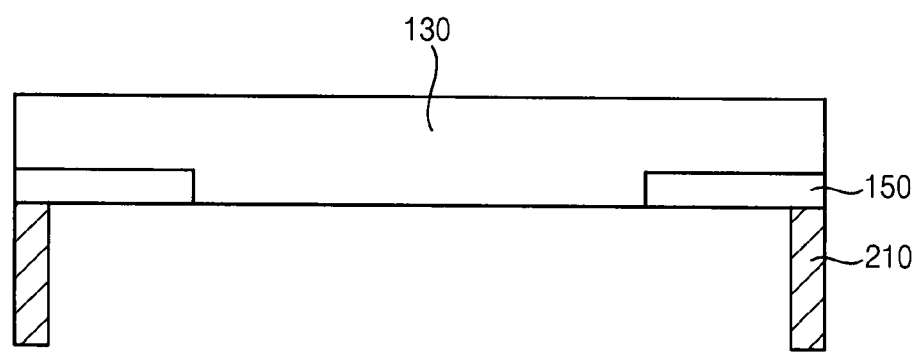

Referring to FIG. 5B, a third member 210 may be provided at opposing side portions of the second substrate 130.

Figure 5C:
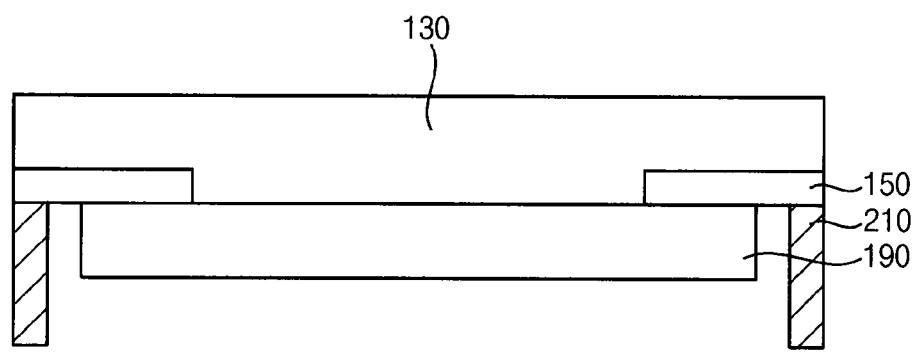

Referring to FIG. 5C, a resin may be provided at a bottom of the second substrate 130. The resin may be a photopolymer resin, and may be in a liquid state.

Figure 5D:
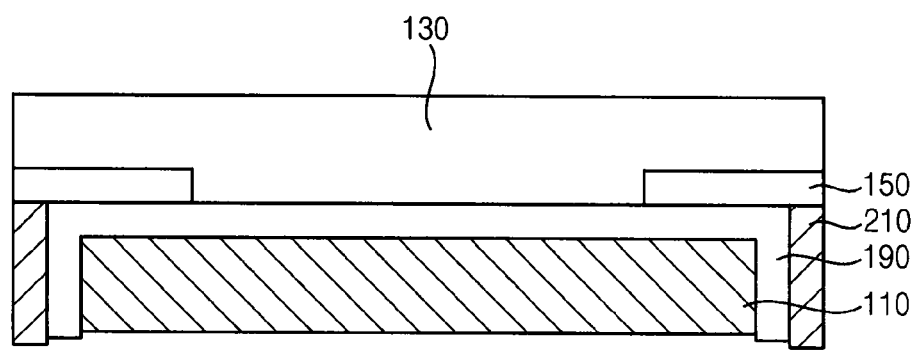

Referring to FIG. 5D, a first substrate 110 is provided to press the resin on the bottom surface of the second substrate 130. In such an embodiment, when the resin is pressurized by a top surface of the first substrate 110, the resin may fill a space between the first substrate 110 and second substrate 130, and then the resin may have a thin film structure disposed between the first substrate 110 and second substrate 130. In such an embodiment, the resin layer 190 may adhere to the first member 150 and the second substrate 130.

Figure 5E:
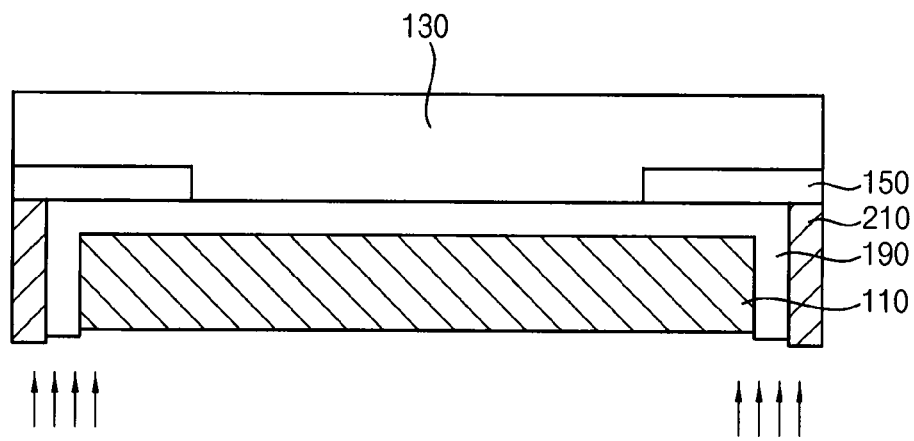

Referring to FIG. 5E, a distal end of the resin layer 190, which is in a liquid state, is cured by an UV ray of a laser irradiation device.

Figure 5F:
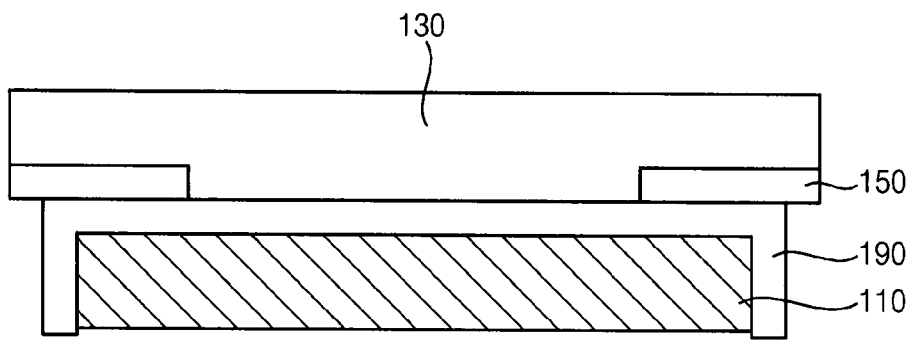

Referring to FIG. 5F, after the resin layer 190 is cured, and then the third member 210 may be removed from the second substrate 130 and the cured resin layer 190. In an exemplary embodiment, a joint member (not shown) of the display apparatus 200 may be provided in a space corresponding to the removed the third member 210.

Accordingly, in an exemplary embodiment of a manufacturing process of the display apparatus 200, the third member 210 is provided to the display apparatus 200, when the resin is formed between the first substrate 110 and the second substrate 130, a bubble is not generated in the resin layer 190, such that a defect in of the display apparatus 200 may be decreased.

Figure 6:
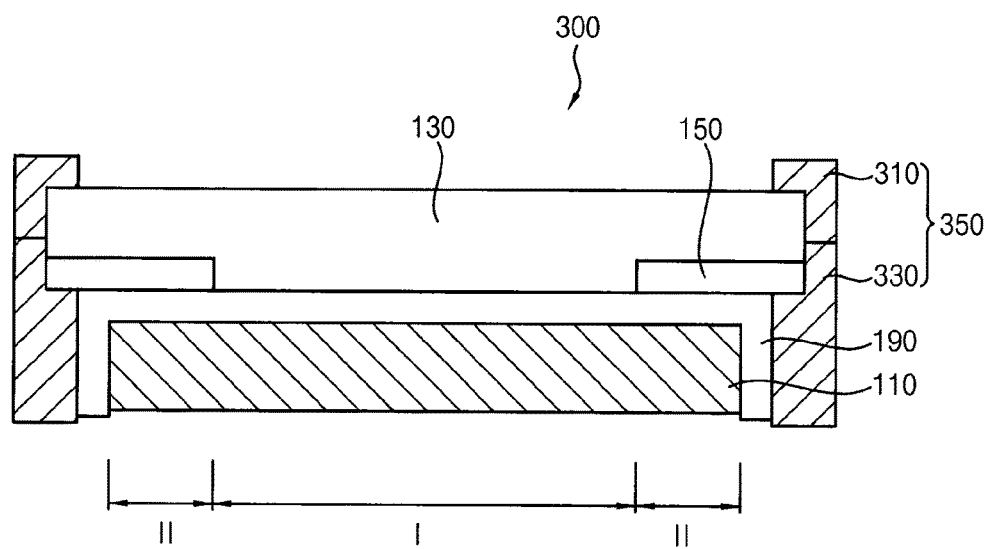
FIG. 6 is a cross-sectional view illustrating another alternative exemplary embodiment of a display apparatus in accordance with the invention.

FIG. 6 is a cross-sectional view illustrating another alternative exemplary embodiment of a display apparatus in accordance with the invention.

Referring to FIG. 5, a display apparatus 300 may include a first substrate 110, a second substrate 130, a first member 150, a complex member 350 and a resin layer 190.

The first substrate 110 may include a display panel. In one exemplary embodiment, for example, the first substrate 110 may include an OLED panel including an OLED and a TFT. The first substrate 110 may include a display region I and a peripheral region II. The display region I may be disposed in a middle portion of the first substrate 110, the peripheral region II may be disposed on opposing side portions of the first substrate 110, and the peripheral region II may surround at least a portion of the display region I. The first substrate 110 may include glass-based materials, flexible plastic-based materials, or the like. In one exemplary embodiment, for example, the first substrate 110 may include a glass substrate, a quartz substrate, a polymer resin substrate, or the like.

The second substrate 130 may oppose the first substrate 110. The second substrate 130 may include transparent glass materials. In one exemplary embodiment, for example, the second substrate 130 may include a tempered glass. In an exemplary embodiment, a size of the second substrate 130 may be larger than a size of the first substrate 110. The resin layer 190 may be disposed between the first substrate 110 and the second substrate 130. In an exemplary embodiment, a thickness of the resin layer 190 may be very thin. Thus, in such an embodiment, a distance between the first substrate 110 and the second substrate 130 may be very short, and a difference of a size of the first substrate 110 and the second substrate 130 may be very small.

The first member 150 may be disposed at a bottom surface of the second substrate 130 on the peripheral region II. The first member 150 may include light shielding materials. The first member 150 may have a black color. In one exemplary embodiment, for example, the first member 150 may include a black matrix.

The complex member 350 may include a first part 310 and a second part 330. In such an embodiment, the first part 310 and the second part 330 may be separable from each other.

The complex member 350 may surround at least a portion (e.g., side portions) of the first substrate 110, the second substrate 130, the first member 150 and the resin layer 190, and the complex member 350 may be disposed at opposing side portions of the second substrate 130 and spaced apart from the first substrate 110.

The first part 310 may cover a portion (e.g., an edge portion) of a top surface on the peripheral region II of the second substrate 130. In an exemplary embodiment, after manufacturing processes of the display apparatus 200, the complex member 350 may be separate from the second substrate 130. In such an embodiment, where the complex member 350 separates from the second substrate 130, the second part 330 may have low adhesion to the resin layer 190. Thus, the second part 330 may include a material which has low adhesion to a photopolymer resin. In one exemplary embodiment, for example, the third member 210 may include fluorine (F) or the like.

The first part 310 may include an opening portion which exposes a top surface of the second substrate 130. The second part 330 may include a protruding portion which surrounds at least a portion (e.g., side portions) of the first substrate 110 and the resin layer 190. In one exemplary embodiment, for example, the opening portion of first part 310 and the protruding portion may be combined or separated.

In a lamination process of an exemplary embodiment of a method of manufacturing the display apparatus 200, a resin deposed on the second substrate 130 may be pressurized by the first substrate 110. The pressurized resin between the first substrate 110 and the second substrate 130130 may have a shape of a thin layer. In such a lamination process, a block member that blocks a resin flowing into an outside opposing may be provided at side portions of the first substrate 110 and the second substrate 130. In an exemplary embodiment, the second part 330 may function substantially as the block member. In such an embodiment, the second part 330 may not completely block the resin, and the second part 330 may guide the resin to fill in a space between the first substrate 110 and the second part 330 spaced apart from the first substrate 110.

The resin layer 190 may be disposed between the first substrate 110 and the second substrate 130 and between the first substrate 110 and the second part 330, and the resin layer 190 may cover a top surface of the first substrate 110. The resin layer 190 may include a photopolymer resin, for example. The photopolymer resin may have a high transmittance and high adhesion to a predetermined material. The resin layer 190 may have high adhesion to the first substrate 110 and the second substrate 130. In such a lamination process, a distal end of the resin, which is ejected from a space between the first substrate 110 and the second part 330 spaced apart from the first substrate 110, is cured by an UV ray of a laser irradiation device such that the distal end of resin layer 190 includes a photo-cured resin.

FIGS. 7A to 7F are cross-sectional views showing an exemplary embodiment of a method of manufacturing the display apparatus of FIG. 6.

Figure 7A:
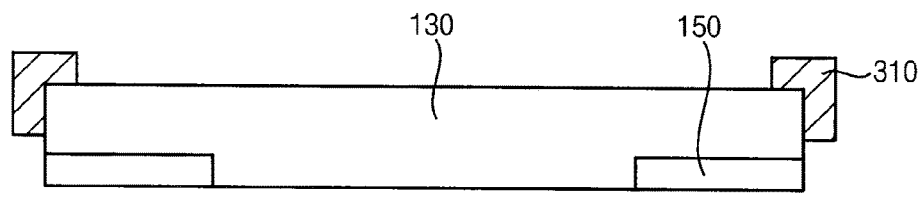
FIGS. 7A to 7F are cross-sectional views for describing a method of manufacturing the display apparatus of FIG. 6.

Referring to FIG. 7A, a first member 150 may be provided, e.g., formed, at a bottom surface on a peripheral region II of the second substrate 130. The second substrate 130 including the first member 150 may be provided at a bottom surface of a first part 310 of a complex member 350. In an exemplary embodiment, a POL (not shown) may be disposed at a bottom surface of the second substrate 130 including the first member 150. The POL may block light entered from an outside, and light emitted from a light emitting device of the display apparatus, e.g., an OLED, may pass through the POL toward the outside.

Figure 7B:
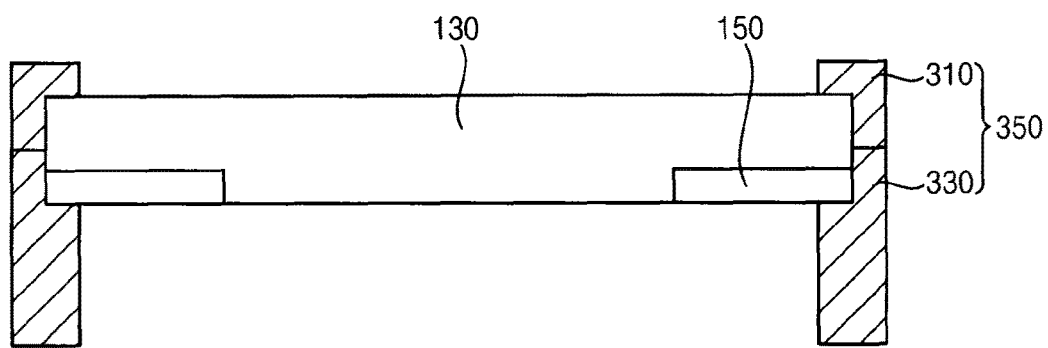

Referring to FIG. 7B, a second part 330 of a complex member 350 may be provided on the first part 310 provided at opposing side portions of the second substrate 130. When the first part 310 and the second part 330 are combined, the second substrate 130 may be surrounded by the complex member 350.

Figure 7C:
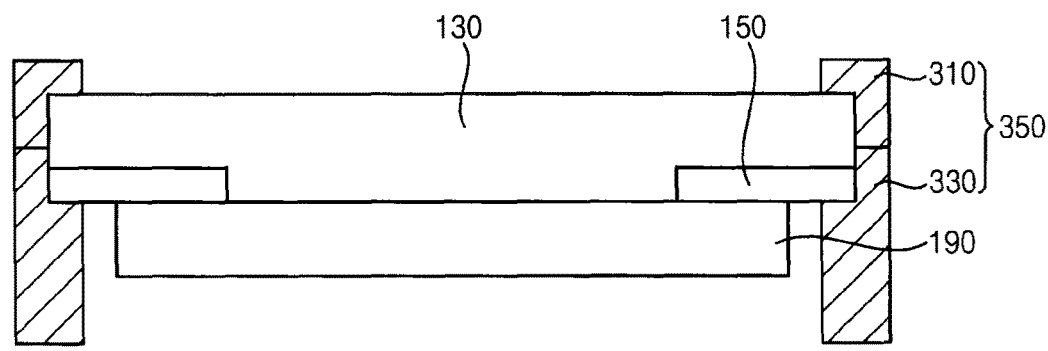

Referring to FIG. 7C, a resin may be provided, e.g., disposed, at a bottom of the second substrate 130. The resin may be a photopolymer resin, and may be in a liquid state.

Figure 7D:
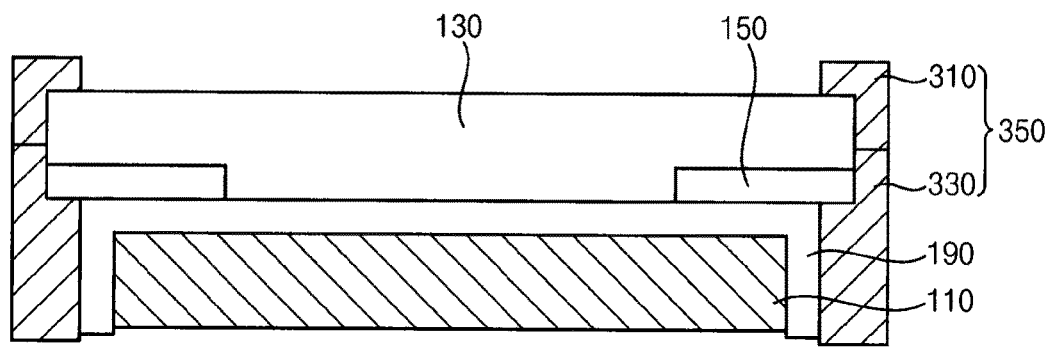

Referring to FIG. 7D, in an exemplary embodiment, the resin is pressurized by a top surface of the first substrate 110, such that the resin may fill a space between the first substrate 110 and second substrate 130, and the resin have a thin film structure disposed between the first substrate 110 and second substrate 130. In such an embodiment, the resin layer 190 may adhere to the first member 150 and the second substrate 130.

Figure 7E:
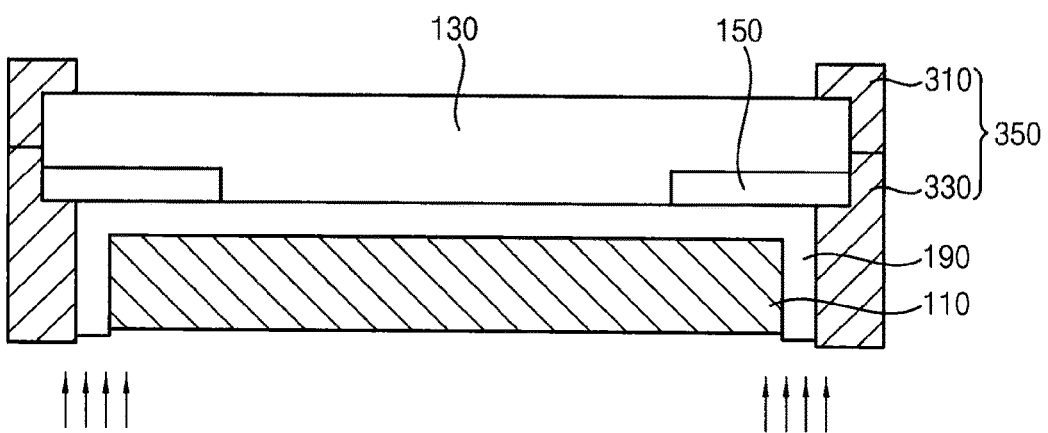

Referring to FIG. 7E, a distal end of the resin layer 190, which is a liquid state, is cured by an UV ray of a laser irradiation device.

Figure 7F:
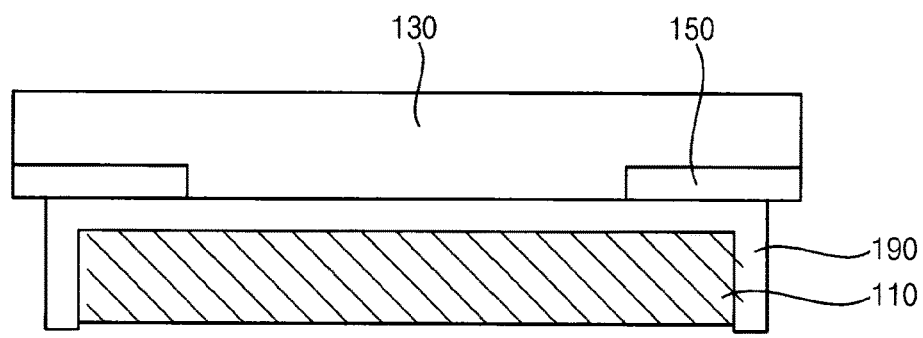

Referring to FIG. 7F, after the resin layer 190 is cured, and then the second part 330 may be removed from the second substrate 130 and the cured resin layer 190, and then the first part 310 may be removed. In an exemplary embodiment, a joint member of the display apparatus 300 may be provided in a space corresponding to the removed complex member 350.

Accordingly, in an exemplary embodiment of a manufacturing process of the display apparatus 300, the complex member 350 is provided to the display apparatus 300, such that when the resin is formed between the first substrate 110 and the second substrate 130, a bubble is not generated in the resin layer 190, such that a defect in the display apparatus 300 may be decreased.

Figure 8:
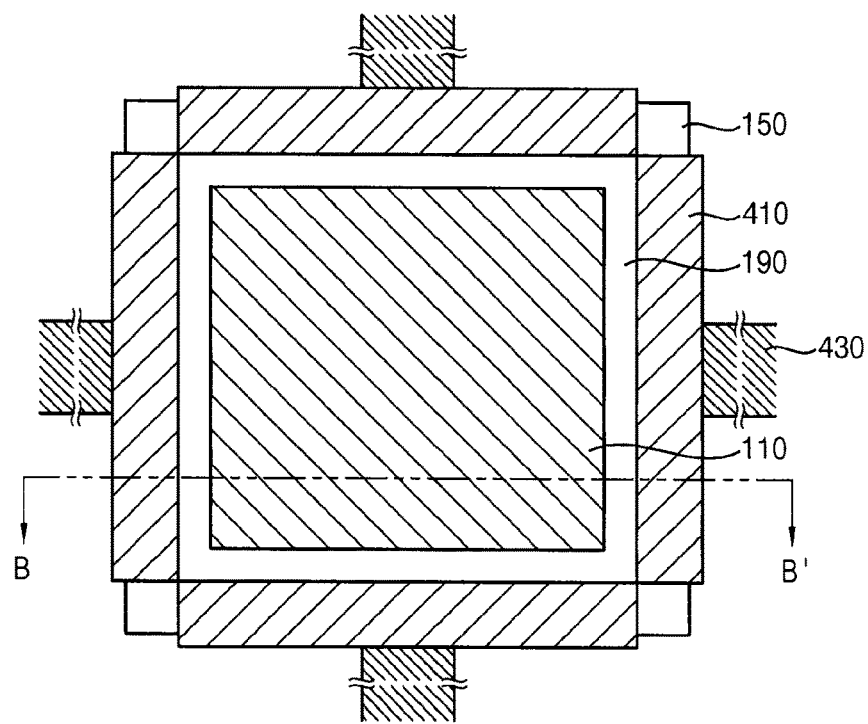
FIG. 8 is a plan view illustrating another alternative exemplary embodiment of a display apparatus in accordance with the invention.
Figure 9:
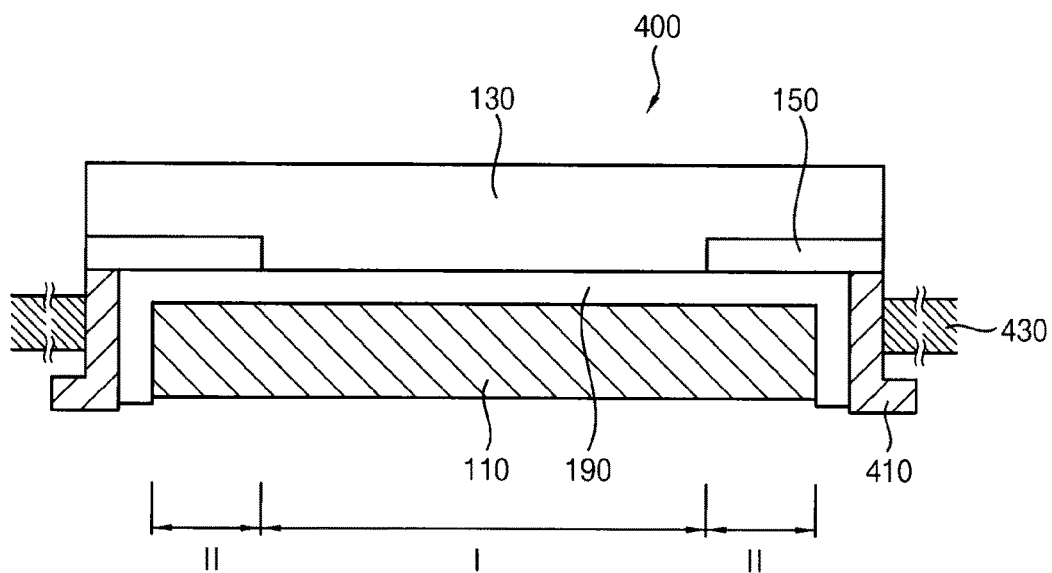
FIG. 9 is a cross-sectional view taken along line B-B' in FIG. 8.

FIG. 8 is a plan view illustrating another alternative exemplary embodiment of a display apparatus in accordance with exemplary embodiments of the invention, and FIG. 9 is a cross-sectional view taken along line B-B' in FIG. 8.

Referring to FIG. 8 and FIG. 9, a display apparatus 400 may include a first substrate 110, a second substrate 130, a first member 150, a plurality of second members 410, a joint member 430 and a resin layer 190.

The first substrate 110 may include a display panel. In one exemplary embodiment, for example, the first substrate 110 may include an OLED panel including an OLED and a TFT. The first substrate 110 may include a display region I and a peripheral region II. The display region I may be disposed in a middle portion of the first substrate 110, the peripheral region II may be disposed on opposing side portions of the first substrate 110, and the peripheral region II may surround the display region I. In an exemplary embodiment, the first substrate 110 may include glass-based materials, flexible plastic-based materials, or the like. In one exemplary embodiment, for example, the first substrate 110 may include a glass substrate, a quartz substrate, a polymer resin substrate, or the like.

The second substrate 130 may be disposed opposite to the first substrate 110. The second substrate 130 may include transparent glass materials. In one exemplary embodiment, for example, the second substrate 130 may include a tempered glass. A size of the second substrate 130 may be larger than a size of the first substrate 110. The resin layer 190 may formed between the first substrate 110 and the second substrate 130. In an exemplary embodiment, a thickness of the resin layer 190 may be very thin. Thus, a distance between the first substrate 110 and the second substrate 130 may be very short, and a difference of a size of the first substrate 110 and the second substrate 130 may be very small. As illustrated in FIG. 8, the second members 410 may be disposed on the peripheral region II of the second substrate 130, and the second members 410 may surround at least a portion (e.g., side portions) of the resin layer 190 and the first substrate 110.

The first member 150 may be disposed at a bottom surface of the second substrate 130 on the peripheral region II. The first member 150 may include light shielding materials. The first member 150 may have a black color. In one exemplary embodiment, for example, the first member 150 may include a black matrix.

The second members 410 may surround the first substrate 110 and the resin layer 190, and the second member 140 may be disposed at a bottom surface on the peripheral region II of the second substrate 130 and spaced apart from the first substrate 110. In an exemplary embodiment, as illustrated in FIG. 8, the second members 410 may include at least four second members. In such an embodiment, the second members 410 may be mechanically connected to the joint member 430. After manufacturing processes of the display apparatus 400, the second members 410 may be separated from the second substrate 130 and resin layer 190. In such an embodiment, where the second members 410 and the resin layer 190 are separated, the second members 410 may have low adhesion to the resin layer 190. In such an embodiment, the second members 410 may include a material which has low adhesion to a photopolymer resin. In one exemplary embodiment, for example, the third member 210 may include fluorine (F) or the like.

In a lamination process of an exemplary embodiment of a method of manufacturing the display apparatus 400, a resin deposed on the second substrate 130 may be pressurized by the first substrate 110. The pressurized resin may between the first substrate 110 and the second substrate 130 may have a shape of a thin layer. In such a lamination process, a block member that blocks a resin flowing into an outside may be provided at opposing side portions of the first substrate 110 and the second substrate 130. In an exemplary embodiment, the second members 410 may substantially function as the block member. In such an embodiment, the second members 410 may not completely block the resin. The second members 410 may guide the resin to fill in a space between the first substrate 110 and the second members 410 spaced apart from the first substrate 110.

The joint member 430 may be mechanically connected at an outside of the second members 410. A manufacturing device of the display apparatus 400 may include the joint member 430. The joint member 430 connected to the second members 410 may move forward to and backward from the first substrate 110 (e.g., in a reciprocating motion).

The resin layer 190 may be disposed between the first substrate 110 and the second substrate 130 and between the first substrate 110 and the second members 410, and the resin layer 190 may cover a top surface of the first substrate 110. In an exemplary embodiment, the resin layer 190 may include a photopolymer resin. In such an embodiment, the photopolymer resin may have a high transmittance, and high adhesion to a predetermined material. The resin layer 190 may have high adhesion to the first substrate 110 and the second substrate 130. In the lamination process, a distal end of the resin, which is ejected from a space between the first substrate 110 and the second part 330 spaced apart from the first substrate 110, is cured by an UV ray of a laser irradiation device. As illustrated in FIG. 8, the laser irradiation device may irradiate the UV ray along with a bottom surface of the resin layer 190 between the first substrate 110 and the second members 410, and a bottom of the resin layer 190 may be cured such that the distal end of resin layer 190 includes a photo-cured resin.

FIGS. 10A to 10E are cross-sectional views showing an exemplary embodiment of a method of manufacturing the display apparatus of FIG. 9.

Figure 10A:
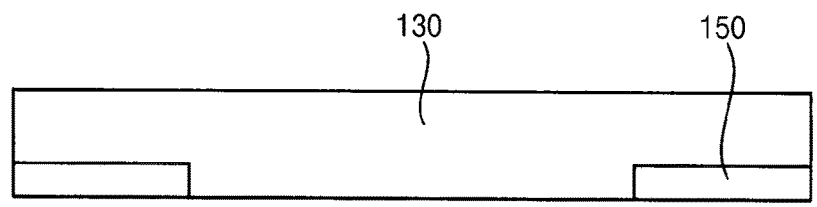
FIGS. 10A to 10E are cross-sectional views showing an exemplary embodiment of a method of manufacturing the display apparatus of FIG. 9.

Referring to FIG. 10A, a first member 150 may be provided, e.g., formed, at a bottom surface on a peripheral region II of the second substrate 130. In an exemplary embodiment, a POL (not shown) may be disposed at a bottom surface of the second substrate 130 including the first member 150. The POL may block light entered from an outside, and light emitted from a light emitting device of the display apparatus, e.g., an OLED, may pass through the POL toward the outside.

Figure 10B:
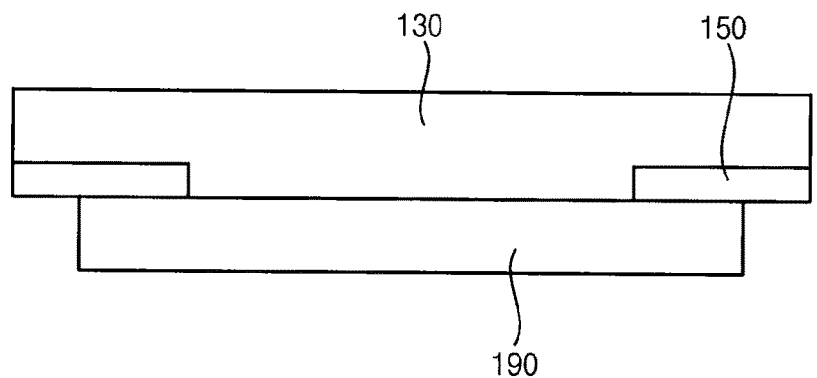

Referring to FIG. 10B, a resin may be provided at a bottom of the second substrate 130. The resin may be a photopolymer resin, and may be in a liquid state.

Figure 10C:
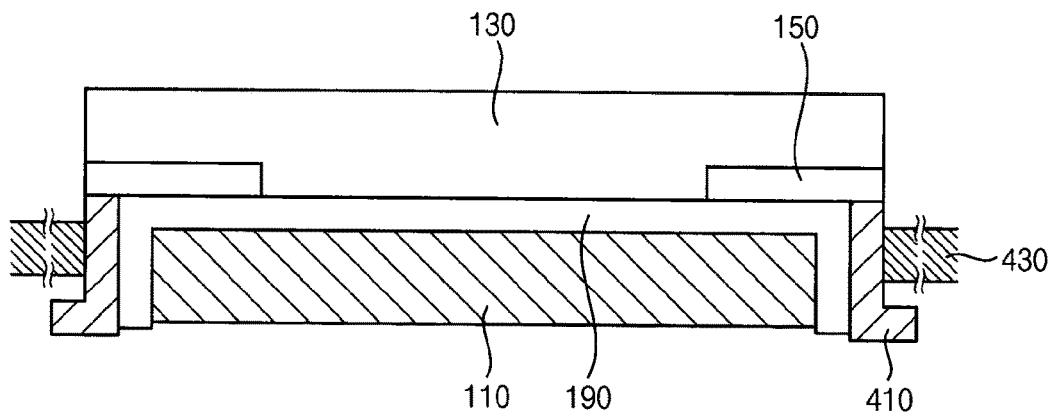

Referring to FIG. 10C, the resin is pressurized by a top surface of the first substrate 110. When the resin is pressurized, the second members 410 may be provided, e.g., disposed, at a bottom surface of the second substrate 130 in the peripheral region II. The second members 410 may be connected to the joint member 430, and the second members 410 may be moved forward by the joint member 430. When the resin is pressurized by a top surface of the first substrate 110, the resin may fill a space between the first substrate 110 and second substrate 130, and then the resin may have a thin film structure disposed between the first substrate 110 and second substrate 130. In an exemplary embodiment, the resin layer 190 may adhere to the first member 150 and the second substrate 130.

Figure 10D:
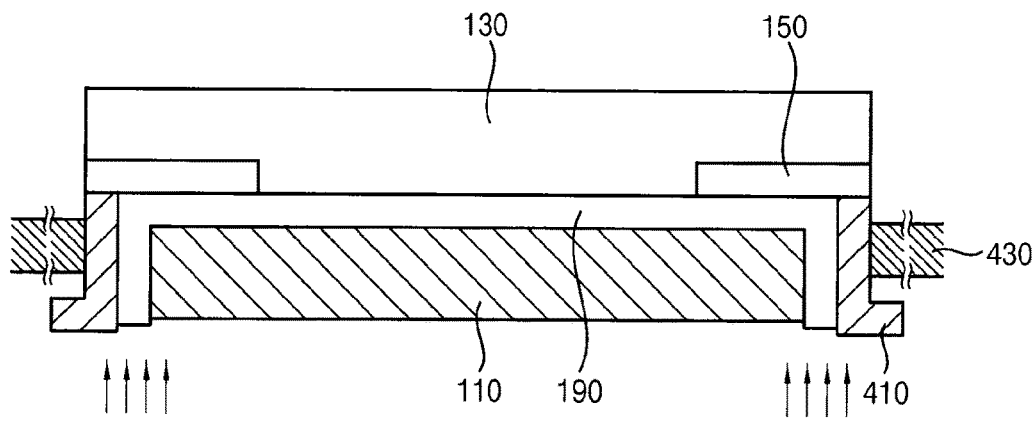

Referring to FIG. 10D, a distal end of the resin layer 190, which is a liquid state, is cured by an UV ray of a laser irradiation device.

Figure 10E:
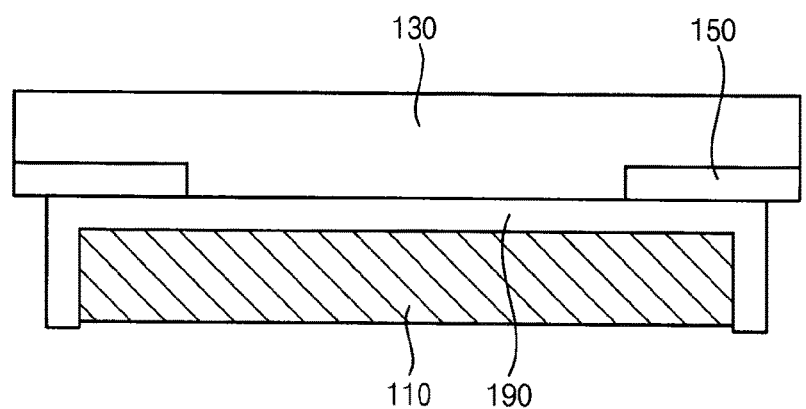

Referring to FIG. 10E, after the resin layer 190 is cured, and then the second members 410 may be removed from the second substrate 130 and the cured resin layer 190. In such an embodiment, the second members 410 may be connected to the joint member 430, and the second members 410 may be moved backward from the first substrate 110 by the joint member 430.

Accordingly, in an exemplary embodiment of a manufacturing process of the display apparatus 400, the second members 410 and the joint member 430 are provided to the display apparatus 400, when the resin is formed between the first substrate 110 and the second substrate 130, a bubble is not generated in the resin layer 190, such that a defect in the display apparatus 400 may be decreased.

The invention may be applied to the entire system device having the resin layer. In one exemplary embodiment, for example, the display apparatus may be included the mobile phone, the smart phone, the laptop computer, the tablet computer, the personal digital assistant ("PDA"), the portable multimedia player ("PMP"), the digital camera, the music player, the portable game console, the navigation, or the like.

The foregoing is illustrative of exemplary embodiments, and is not to be construed as limiting thereof. Although a few exemplary embodiments have been described, those skilled in the art will readily appreciate that many modifications are possible in the exemplary embodiments without materially departing from the novel teachings and advantages of exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
a first substrate comprising a display panel in which a display region and a peripheral region are defined, wherein the peripheral region surrounds the display region;
a second substrate disposed opposite the first substrate such that a first space is formed between the first substrate and the second substrate;
a first member disposed at a bottom surface of the second substrate corresponding to the peripheral region of the first substrate;
a second member which surrounds the first substrate, the second substrate, and the first member, the second member being in direct contact with opposing side portions of the second substrate, the second member being spaced apart from opposing portions of the first substrate such that a second space is formed between the first substrate and the second member; and
a resin layer disposed at the first space and the second space, the resin layer being in direct contact with an upper surface and opposing side portions of the first substrate, a lower surface of the second substrate, and a first surface of the second member.

2. The display apparatus of claim 1, wherein
the resin layer disposed on the second substrate is pressurized by a top surface of the first substrate, and
the resin layer has a thin film structure disposed between the first substrate and the second substrate.

3. The display apparatus of claim 1, wherein a distal end of the resin layer comprises a photo-cured resin.

4. The display apparatus of claim 1, wherein a size of the second substrate is larger than a size of the first substrate.

5. The display apparatus of claim 1, wherein the display panel includes an organic light emitting diode panel.

6. The display apparatus of claim 5, wherein the organic light emitting diode panel includes an organic light emitting diode and a thin film transistor.

7. The display apparatus of claim 1, wherein the first surface of the second member faces the opposing side portions of the first substrate, and
wherein a portion of the first surface is in direct contact with the second substrate, and a remaining portion of the first surface is in direct contact with the resin layer.

8. A display apparatus, comprising:
a first substrate comprising a display panel in which a display region and a peripheral region are defined, wherein the peripheral region surrounds the display region;
a second substrate disposed opposite the first substrate such that a first space is formed between the first substrate and the second substrate;
a first member disposed at a bottom surface of the second substrate corresponding to the peripheral region of the first substrate;

a complex member comprising a first part, and a second part, the first part and the second part being separable from each other, which surrounds the first substrate, the second substrate, and the first member, the complex member being in direct contact with opposing side portions of the second substrate, the complex member being spaced apart from opposing portions of the first substrate such that a second space is formed between the first substrate and the second member; and a resin layer disposed at the first space and the second space, the resin layer being in direct contact with an upper surface and opposing side portions of the first substrate, a lower surface of the second substrate, and a first surface of the complex member.

9. The display apparatus of claim 8, wherein the complex member comprises:

a first part which covers a portion of a top surface of the second substrate corresponding to the peripheral region; and a second part which covers a portion of a bottom surface of the second substrate corresponding to the peripheral region.

10. The display apparatus of claim 9, wherein the first part and the second part are separable from each other.

11. The display apparatus of claim 8, wherein the resin layer disposed on the second substrate is pressurized by a top surface of the first substrate, and the resin layer has a thin film structure disposed between the first substrate and the second substrate.

12. The display apparatus of claim 8, wherein a distal end of the resin layer comprises a photo-cured resin.

13. The display apparatus of claim 8, wherein a size of the second substrate is larger than a size of the first substrate.

14. The display apparatus of claim 8, wherein the complex member is separable from the second substrate and the resin layer.

* * * * *